(12) United States Patent
Zeng et al.

(10) Patent No.: US 7,535,080 B2
(45) Date of Patent: May 19, 2009

(54) REDUCING PARASITIC MUTUAL CAPACITANCES

(75) Inventors: Xiang Yin Zeng, Shanghai (CN); Jiangqi He, Gilbert, AZ (US); BaoShu Xu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 445 days.

(21) Appl. No.: 11/174,246

(22) Filed: Jun. 30, 2005

(65) Prior Publication Data

US 2007/0001260 A1 Jan. 4, 2007

(51) Int. Cl.
*H01L 29/93* (2006.01)

(52) U.S. Cl. .................... 257/535; 257/784; 257/532; 257/E27.016; 257/E27.017; 257/E27.019

(58) Field of Classification Search .............. 455/78; 333/26; 428/209; 257/784, 535, 532, E27.016, 257/E27.017, E27.019
See application file for complete search history.

(56) References Cited

U.S. PATENT DOCUMENTS

| | | | | |
|---|---|---|---|---|
| 5,982,250 | A * | 11/1999 | Hung et al. | 333/26 |
| 6,761,963 | B2 * | 7/2004 | Casper et al. | 428/209 |
| 7,092,678 | B2 * | 8/2006 | Shih | 455/78 |
| 2003/0218165 | A1 | 11/2003 | Lian et al. | |

OTHER PUBLICATIONS

R. Croswell, et al., "Embedded Mezanine Capacitor Technology for Printed Wiring Boards", Aug. 1, 2002, http://www.circuitree.com/CDA/ArticleInformation/coverstory/BNPCoverStoryItem/0,2135...
R. Croswell, et al., "Simplifying PWB Assembly by Utilizing Embedded Passives", Motorola Labs.
J. Laskar, et al., "Multi-Layer 3D System-On-Package (SOP) Archictectures for Highly Integrated Microwave and Millimeter Wave Radio Front-End", Packaging Research Center, School of ECE, Georgia Inst. of Technology.
C.-H. Lee, et al., "A Compact LTCC-Based KuBand Transmitter Module", IEEE Trans. on Adv. Packaging, vol. 25, No. 3, pp. 374-384, Aug. 2002.
A. Vimpari, "The Characterisation of the Integrated RF Passive Components in LTCC", VTT Eletronics, Oulu, Finland.

* cited by examiner

*Primary Examiner*—Davienne Monbleau
*Assistant Examiner*—Monica D Harrison
(74) *Attorney, Agent, or Firm*—Blakely, Sokoloff, Taylor & Zafman LLP

(57) ABSTRACT

A method to reduce parasitic mutual capacitances in embedded passives. A first capacitor is formed by first and second electrodes embedding a dielectric layer. A second capacitor is formed by third and fourth electrodes embedding the dielectric layer. The third and first electrodes are etched from a first metal layer. The fourth and second electrodes are etched from a second metal layer. The first and the fourth electrodes are connected by a connection through the dielectric layer to shield a mutual capacitance between the first and second capacitors.

14 Claims, 5 Drawing Sheets

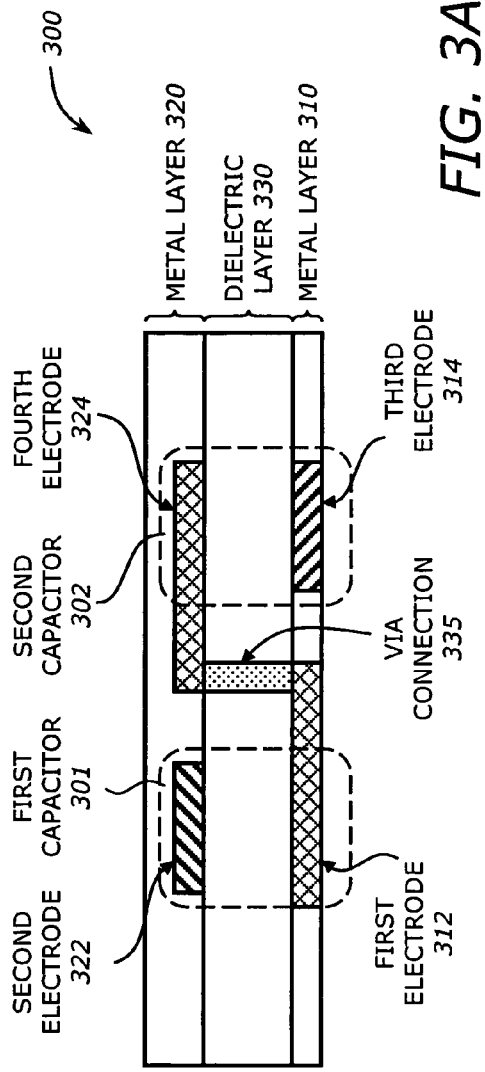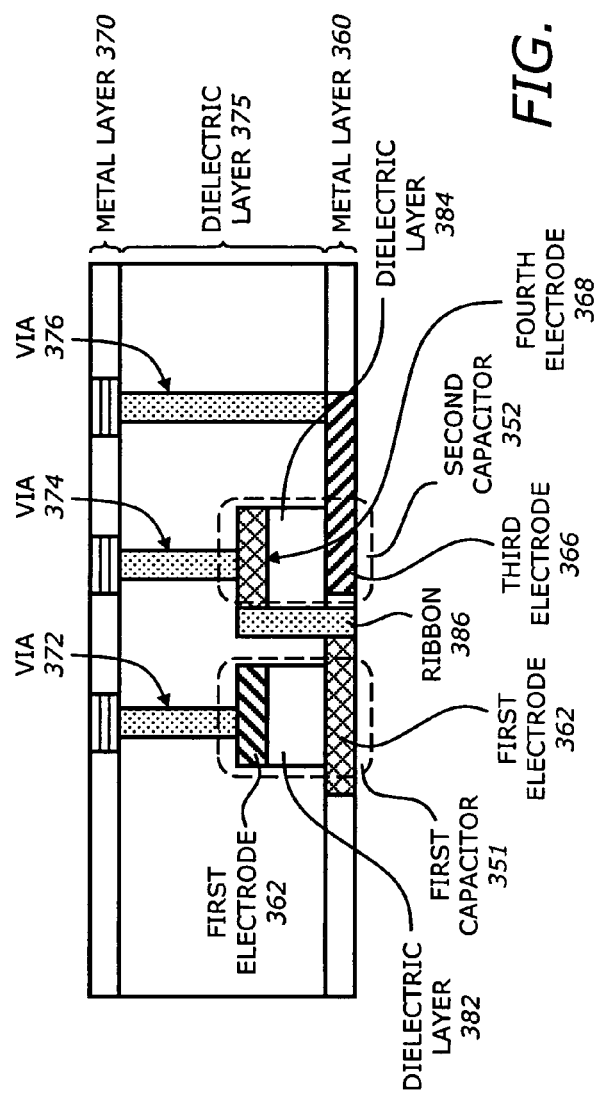
FIG. 3A
FIG. 3B

REDUCING PARASITIC MUTUAL CAPACITANCES

BACKGROUND

1. Field of the Invention

Embodiments of the invention relate to the field of electronic fabrication, and more specifically, to capacitor fabrication.

2. Description of Related Art

Embedded Passives (EP) technology has been increasingly popular in manufacturing radio frequency (RF) communication devices. Passive components such as resistors, capacitors, and inductors, typically contribute a significant portion of the number of components used in wireless and mobile miniature modules. System on chip (SOC), system in package (SIP), or system on package (SOP) utilizing EP technology provides a high degree of integration of passive components.

Capacitors used in RF devices have a significant impact on device performance. When RF functional blocks with lumped elements are built on package, the parasitic mutual capacitances among the capacitors are inevitable. Such parasitic mutual capacitances may cause unwanted component coupling and degrade the electrical performance. Existing techniques to reduce these unwanted mutual capacitances have a number of disadvantages. One technique is to increase the distances of the capacitors. This technique is not effective in reducing mutual capacitances. In addition, it results in increased package form factor.

BRIEF DESCRIPTION OF THE DRAWINGS

Embodiments of the invention may best be understood by referring to the following description and accompanying drawings that are used to illustrate embodiments of the invention. In the drawings:

FIG. 3A is a diagram illustrating capacitors with via connection according to one embodiment of the invention.

FIG. 3B is a diagram illustrating capacitors with ribbon connection according to one embodiment of the invention.

DESCRIPTION

An embodiment of the present invention is a technique to reduce parasitic mutual capacitances in embedded passives. A first capacitor is formed by first and second electrodes embedding a dielectric layer. A second capacitor is formed by third and fourth electrodes embedding the dielectric layer. The third and first electrodes are etched from a first metal layer. The fourth and second electrodes are etched from a second metal layer. The first and the fourth electrodes are connected by a connection through the dielectric layer to shield a mutual capacitance between the first and second capacitors.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

Embodiments of the invention include adjacent capacitors having a connection to reduce the unwanted parasitic mutual capacitance caused by the coupling between the capacitors. The technique is simple to implement, reduces package form factor, and enhances electrical performance.

Figure 1:
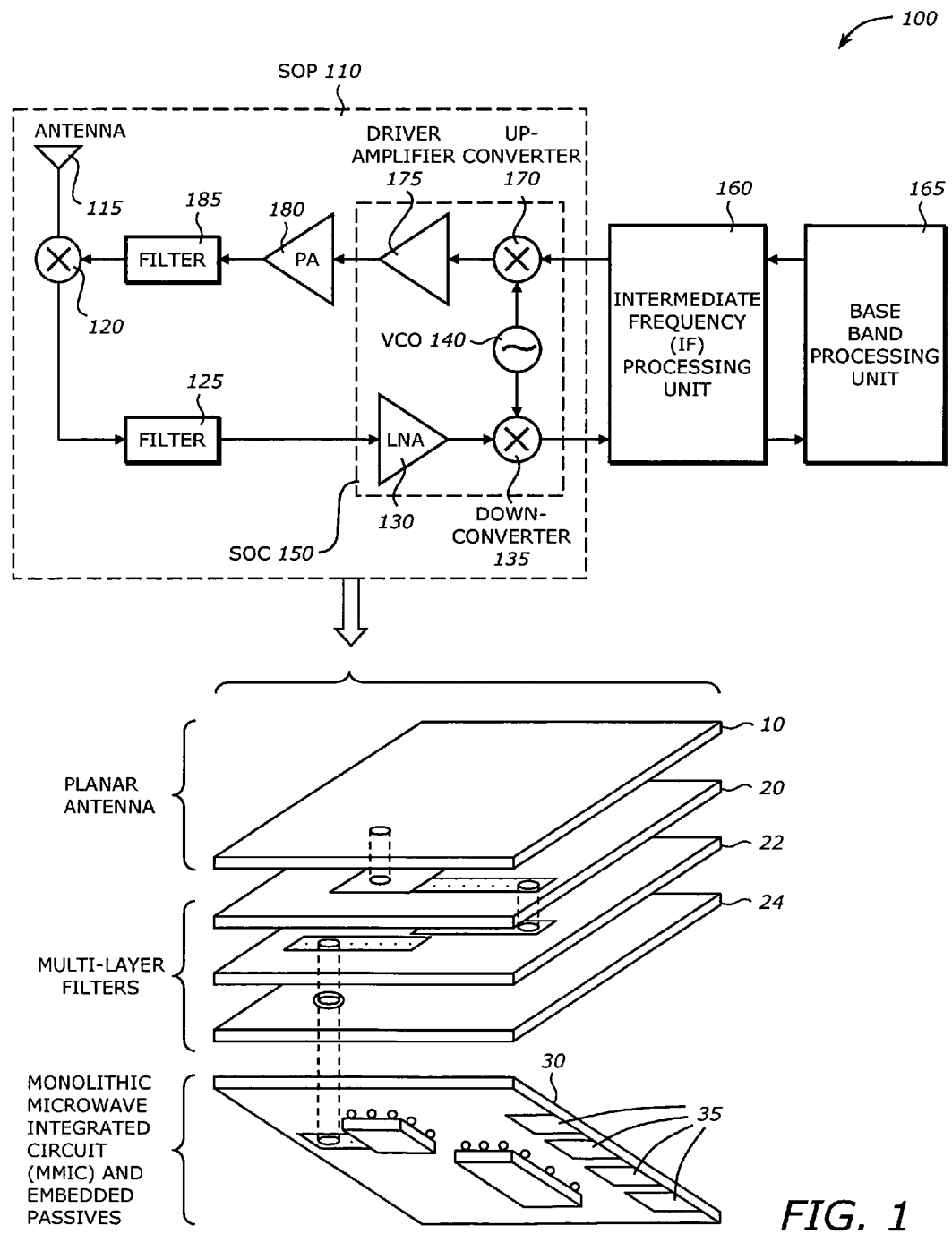
FIG. 1 is a diagram illustrating a system in which one embodiment of the invention can be practiced.

FIG. 1 is a diagram illustrating a system 100 in which one embodiment of the invention can be practiced. The system 100 represents a mobile communication module. It includes a system on package (SOP) 110, an intermediate frequency processing unit 160, and a base-band processing unit 165.

The SOP 110 represents the front end processing unit for the mobile communication module. It is a transceiver incorporating on-package integrated lumped passive components as well as RF components. It includes an antenna 115, a duplexer 120, a filter 125, a system-on-chip (SOC) 150, a power amplifier (PA) 180, and a filter 185.

The antenna 115 receives and transmits RF signals. It is designed in compact micro-strip and strip-line for L and C-band wireless applications. The duplexer 120 acts as a switch to couple to the antenna 115 to the receiver and the transmitter to the antenna 115. The filters 125 and 185 are C-band LTCC-strip-line filter at 5.8 GHz and narrowband performance of 200 MHz suitable for the Institute of Electrical and Electronic Engineers (IEEE) 802.11 wireless local area network (WLAN). The SOC 150 includes a low noise amplifier (LNA) 130, a down converter 135, a local voltage controlled oscillator (VCO) 140, an up converter 170, and a driver amplifier 175. The LNA 130 amplifies the received signal. The down converter 135 is a mixer to convert the RF signal to the IF band to be processed by the IF processing unit 160. The up converter 170 is a mixer to convert the IF signal to the proper RF signal for transmission. The VCO 140 generates modulation signal at appropriate frequencies for down conversion and up conversion. The driver amplifier 175 drives the PA 180. The PA 180 amplifies the transmit signal for transmission.

The IF processing unit 160 includes analog components to process IF signals for receiving and transmission. It may include a band-pass filter and a low pass filter at suitable frequency bands. The base-band processing unit 165 may include analog-to-digital converter (ADC) and digital-to-analog converter (DAC) to convert analog signal to digital data and vice versa. It may include a digital processor with memory and peripheral components to process digital data.

The SOP 110 may be a multi-layer three-dimensional (3D) architecture for a monolithic microwave integrated circuit (MMIC) with EP technology. It may be implemented using Low Temperature Co-fired Ceramics (LTCC) and organic-based technologies. The 3D architecture may include multiple layers include a layer 10 to implement the planar antenna 115, layers 20, 22, and 24 for the filters 125 and 185, and layer 30 for the SOC 150, monolithic microwave integrate circuits (MMICs), and the passive components using EP technology.

In particular, the EP includes lumped capacitors 35 with shielding technique to reduce unwanted mutual capacitances.

Parasitic mutual capacitances are caused by the coupling of adjacent capacitors. These capacitances may degrade electrical performance. Other mutual coupling between inductors and capacitors may also exist. The techniques in embodiments of the invention reduce the undesired effects caused by these mutual capacitances.

Figure 2A:
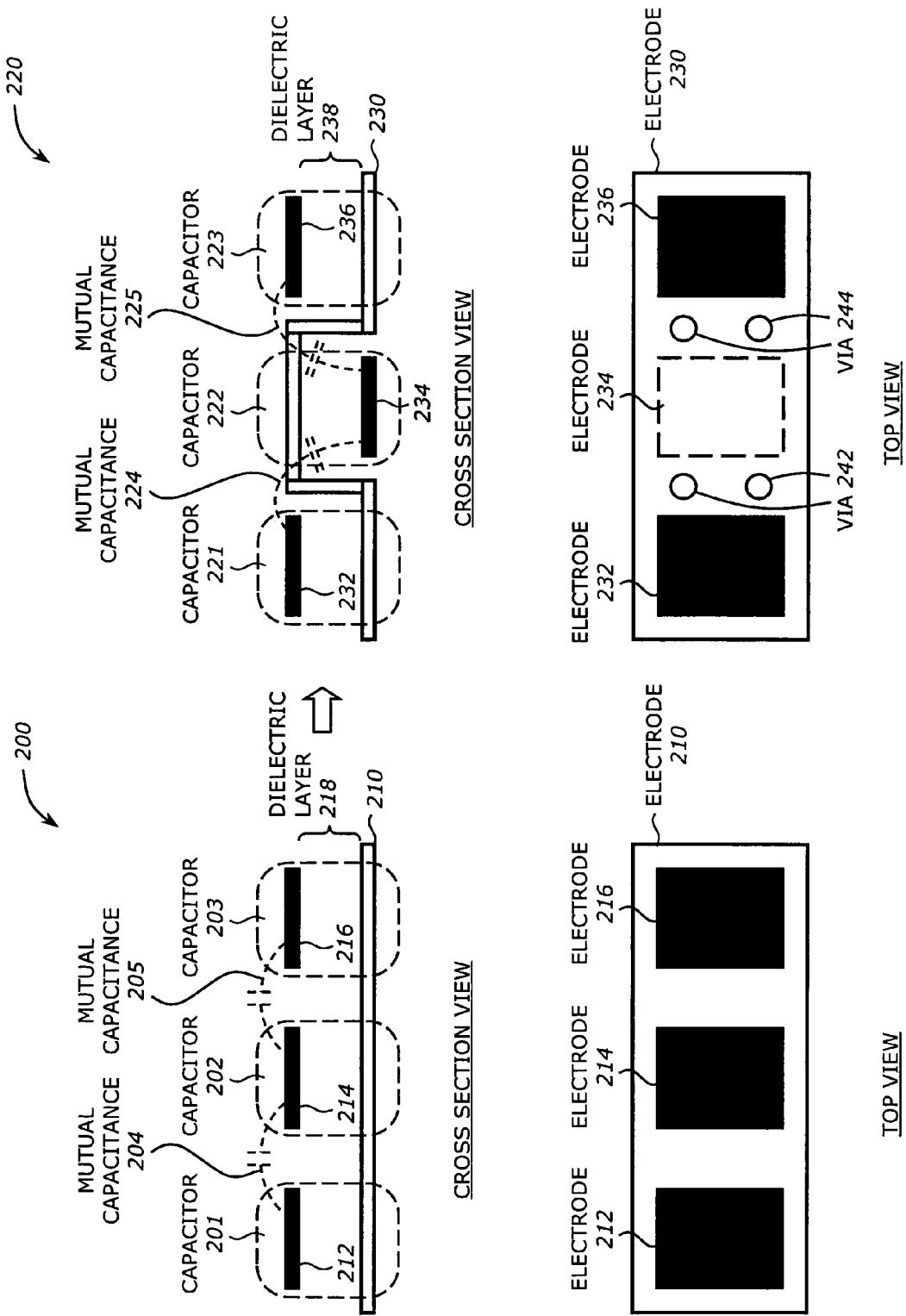
FIG. 2A is a diagram illustrating a design of capacitors sharing a common ground according to one embodiment of the invention.

FIG. 2A is a diagram illustrating a design of capacitors sharing a common ground according to one embodiment of the invention. The design shows a traditional layout 200 and an improved layout 220.

The traditional layout 200 illustrates a top view and a cross sectional view of capacitors that share a common ground. It includes an electrode 210 and three electrodes 212, 214, and 216. The electrodes 212, 214, and 216 and the electrode 210 embed a dielectric layer 218 to form three capacitors 201, 202, and 203 sharing a common terminal. These capacitors are adjacent to each other causing unwanted parasitic mutual capacitances 204 and 205. The mutual capacitance 204 is caused by the coupling between capacitors 201 and 202. The mutual capacitance 205 is caused by the coupling between capacitors 202 and 203.

The improved layout 220 illustrates a top view and a cross sectional view of a new improved design of capacitors. The design uses shielding to block the coupling between adjacent capacitors, resulting in reduced parasitic mutual capacitance. It includes an electrode 230 and three electrodes 232, 234, and 236, and via connections 242 and 244. The electrode 230 has a center portion raised above the electrode 234. The electrodes 232 and 236 are similar to the electrodes 212 and 216 in the traditional layout 200. The electrode 234 is below the center portion of the electrode 230. These electrodes embed a dielectric layer 238 to form three capacitors 221, 222, and 223. The mutual capacitance 224 is caused by the coupling between capacitors 221 and 222. The mutual capacitance 225 is caused by the coupling between capacitors 222 and 223.

The via connections 242 and 244 provide connections between the center portion of the electrode 230 and its two side portions using vias formed through the dielectric layer 238. In effect, the via connection 242 acts as a shield to block the coupling between the capacitors 221 and 222. Due to this shielding, the mutual capacitance 224 is significantly reduced. Similarly, the via connection 244 blocks the coupling between the capacitors 222 and 223, leading to a reduction of the mutual capacitance 225.

Figure 2B:
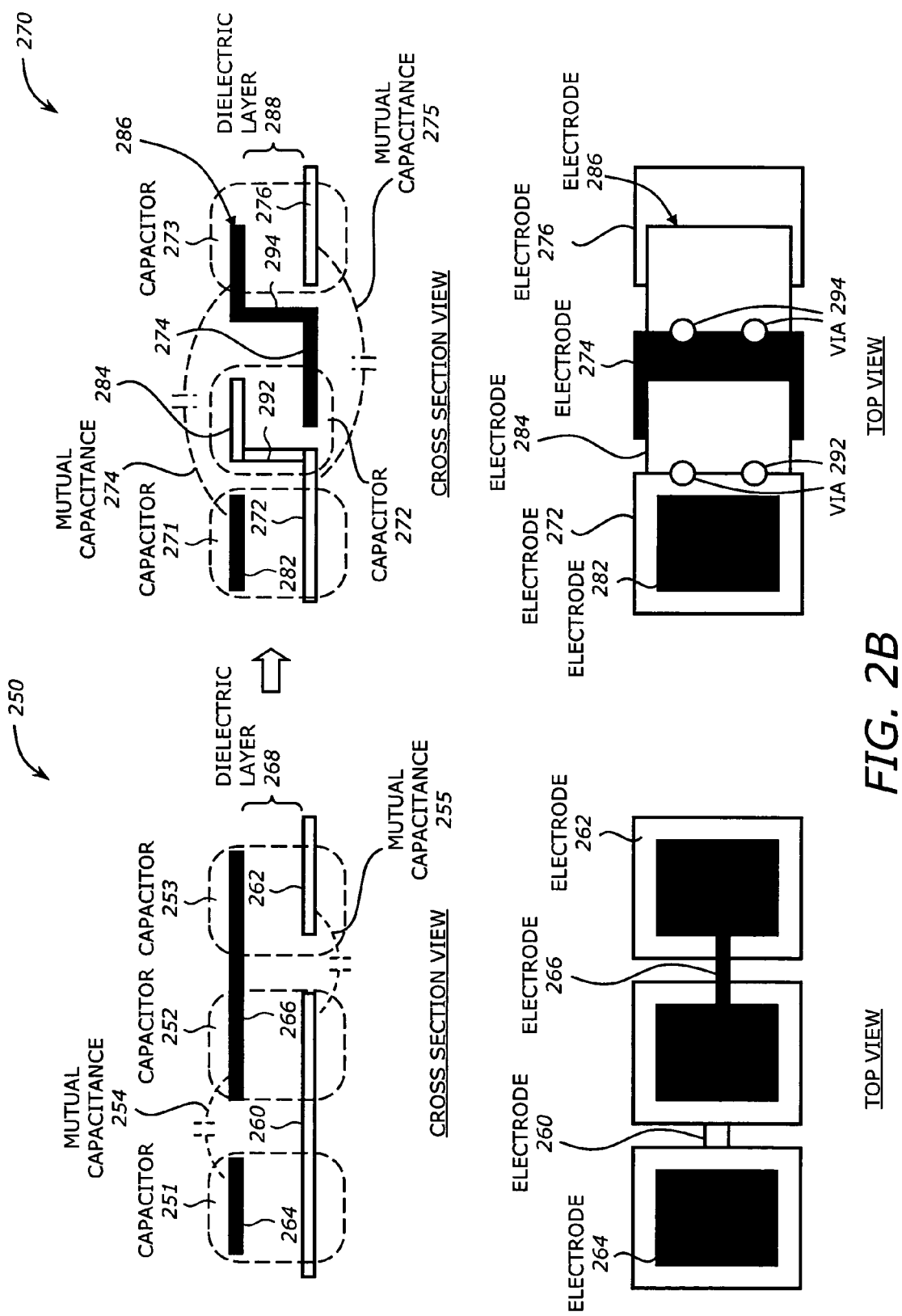
FIG. 2B is a diagram illustrating a design of series capacitors according to one embodiment of the invention.

FIG. 2B is a diagram illustrating a design of series capacitors according to one embodiment of the invention. The design shows a traditional layout 250 and an improved layout 270.

The traditional layout 250 illustrates a top view and a cross sectional view of series capacitors. It includes electrodes 260, 262, 264, and 266. The electrodes 260, 262, 264, and 266 embed a dielectric layer 268 to form three capacitors 251, 252, and 253 in series. These capacitors are adjacent to each other causing unwanted parasitic mutual capacitances 254 and 255. The mutual capacitance 254 is caused by the coupling between electrodes 264 and 266. The mutual capacitance 255 is caused by the coupling between the electrodes 260 and 262.

The improved layout 270 illustrates a top view and a cross sectional view of a new improved design of capacitors. The design uses shielding to block the coupling between adjacent capacitors, resulting in reduced parasitic mutual capacitance. It includes electrodes 272, 274, 276, 282, 284, and 286 and via connections 292 and 294. These electrodes embed a dielectric layer 288 to form three capacitors 271, 272, and 273 in series. The mutual capacitance 274 is caused by the coupling between the electrodes 282 and 286. The mutual capacitance 275 is caused by the coupling between the electrodes 272 and 276.

The via connections 292 and 294 provide connections between the electrodes 272 and 284 and between the electrodes 274 and 286, respectively, using vias formed through the dielectric layer 238. In effect, the via connections 292 and 294 act as a shield to block the coupling between the capacitors 271 and 272. Due to this shielding, the mutual capacitances 274 and 275 are significantly reduced.

FIG. 3A is a diagram illustrating a layout 300 of capacitors with via connection according to one embodiment of the invention. The layout 300 includes metal layers 310 and 320, and a dielectric layer 330.

The metal layer 310 has a first electrode 312 and a third electrode 314. The metal layer has a second electrode 322 and a fourth electrode 324. These electrodes embed the dielectric layer 330 to form a first capacitor 301 and a second capacitor 302. The first capacitor 301 includes the first and second electrodes 312 and 322. The second capacitor 302 includes the third and fourth electrodes 314 and 324. The first and second capacitors 301 and 301 may be formed in the build-up layer on a core layer. A via connection 335 is formed between the first and fourth electrode 312 and 324. The via connection 335 acts as a shield to block the coupling between the first and second capacitors 301 and 302. This blocking results in reduced parasitic mutual capacitance between the two capacitors.

Typically, the use of via connection to reduce mutual capacitance is more suitable for capacitors with small capacitances. Therefore, the dielectric layer 330 is made of a dielectric material of low dielectric constant k (e.g., k<3). However, depending on the process, the dielectric layer 330 may also have a high dielectric constant (e.g., k>10).

FIG. 3B is a diagram illustrating a layout 350 of capacitors with ribbon connection according to one embodiment of the invention. The layout 350 includes metal layers 360 and a dielectric layer 375.

The metal layer 360 includes a first electrode 362 and a third electrode 366. Within the dielectric layer 375 are a second electrode 364 and a fourth electrode 368. These electrodes are etched from a metal layer (not shown). The first and second electrodes 362 and 364 embed a dielectric layer 382 having a high dielectric constant k to form a first capacitor 351. The third and fourth electrodes 366 and 368 embed a dielectric layer 384 having a high dielectric constant k to form a second capacitor 352. A ribbon 386 is formed between the first and fourth electrodes 362 and 368. Vias 372, 374, and 376 are formed to provide connections between the first and second capacitors 351 and 352 to the metal layer 370.

The ribbon 386 acts like a shield to block the coupling between the first and second capacitors 351 and 352, leading to a reduction in parasitic mutual capacitance between the two capacitors. Typically, the use of ribbon connection to reduce mutual capacitance is more suitable for capacitors with large capacitances. Therefore, the dielectric layers 382 and 384 are made of a dielectric material of high dielectric constant k, e.g., k>10. However, depending on the process the dielectric material may also have low dielectric constant k, e.g., k<3.

Simulation data show that the reduction of mutual capacitance may be around 20 dB over a frequency range of 1 GHz to 10 GHz. In addition, the ratio between the mutual capacitance and the self capacitance is reduced to approximately 1.6% for capacitors with shielding from 3.7%-13% for capacitors without shielding.

Figure 4:
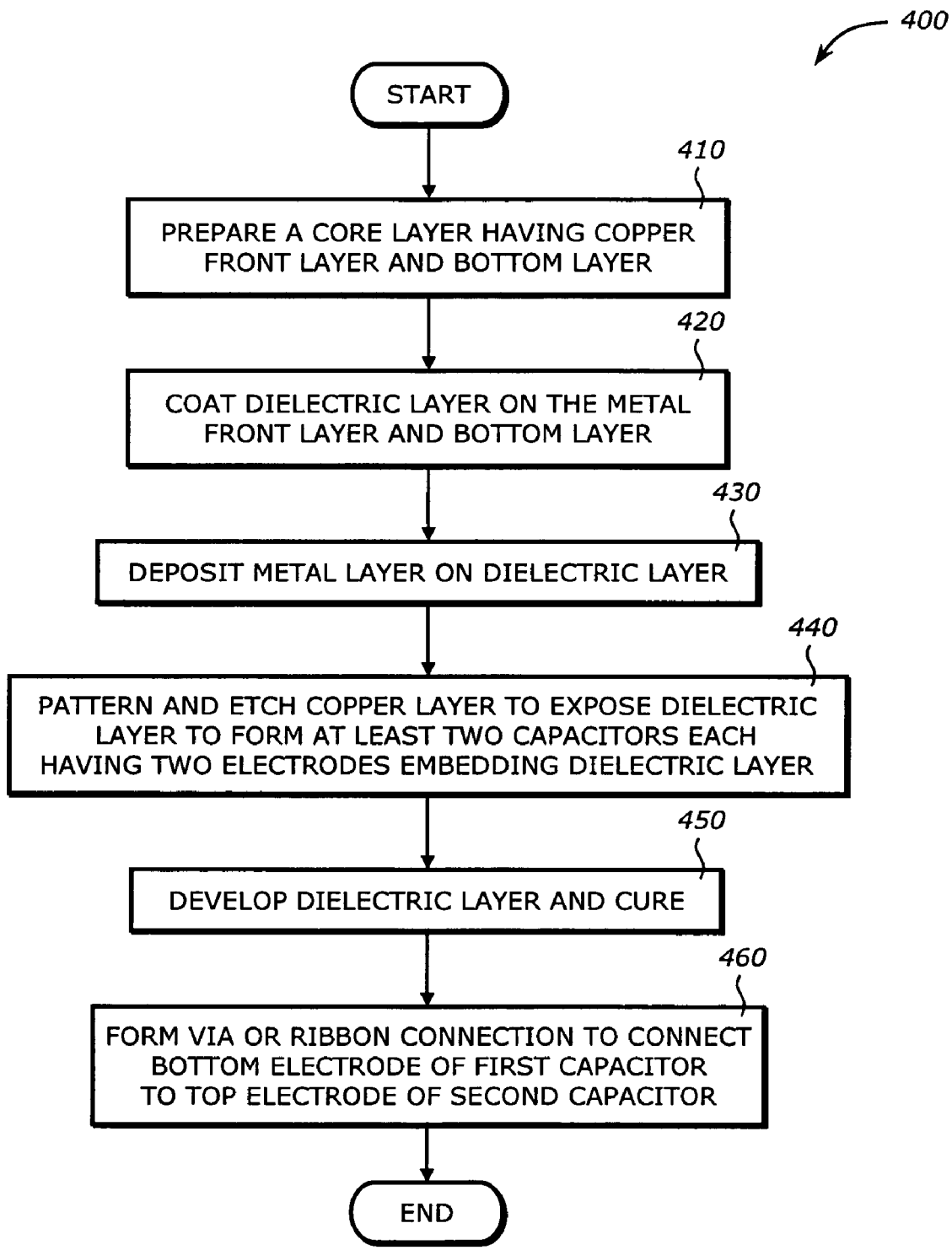
FIG. 4 is a diagram illustrating a process of fabrication of capacitors according to one embodiment of the invention.

FIG. 4 is a diagram illustrating a process 500 of fabrication of capacitors according to one embodiment of the invention.

Upon START, the process 400 prepares a core layer having metal (e.g., copper) front layer and bottom layer embedding the core layer (Block 410). Then, the process 400 coats a dielectric layer on the metal front layer and bottom layer (Block 420). The dielectric layer may be made of a dielectric material having a low or high dielectric constant. Next, the process 400 deposits a metal (e.g., copper) layer on the dielectric layer (Block 430).

Then, the process 400 patterns and etches the metal layers to expose the dielectric layer to form at least two adjacent capacitors, each having two electrodes embedding the dielectric layer (Block 440). The capacitors are formed in the build-up layer on the core layer. Next, the process 400 develops the dielectric layer and cures the two capacitors (Block 450). Then, the process 400 forms a via or a ribbon connection to connect the bottom electrode of the first capacitor to the top electrode of the second capacitor (Block 460). The connection serves as a shield to reduce the parasitic mutual capacitance between the two capacitors. The process 400 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A device comprising:
   a first capacitor comprising a dielectric layer, and first and second electrodes embedding the dielectric layer;
   a second capacitor comprising the dielectric layer, and third and fourth electrodes embedding the dielectric layer, the third and first electrodes comprising a first metal layer, the fourth and second electrodes comprising a second metal layer; and
   a connection connecting the first and the fourth electrodes through the dielectric layer to shield a mutual capacitance between the first and second capacitors.

2. The device of claim 1 wherein the connection comprises a via connection.

3. The device of claim 1 wherein the connection comprises a ribbon connection.

4. The device of claim 1 wherein each of the first and second capacitors comprises a build-up layer.

5. The device of claim 1 wherein the dielectric layer has one of a low dielectric constant and a high dielectric constant.

6. The device of claim 1 wherein each of the first and second capacitors comprises Low Temperature Co-fired Ceramics (LTCC) fabricated components.

7. A system comprising:
   a base-band processing unit to process base-band data;
   and intermediate frequency (IF) processing unit coupled to the base-band processing unit to process an IF signal; and
   a system on package (SOP) coupled to the IF processing unit to process a radio frequency (RF) signal, the SOP comprising multiple layers having an antenna layer, a filter multi-layer, and an embedded passives (EP) layer, the EP layer comprising at least:
   a first capacitor comprising a dielectric layer, and first and second electrodes embedding the dielectric layer,
   a second capacitor comprising the dielectric layer, and third and fourth electrodes embedding the dielectric layer, the third and first electrodes comprising a first metal layer, the fourth and second electrodes comprising a second metal layer;
   and
   a connection connecting the first and the fourth electrodes through the dielectric layer to shield a mutual capacitance between the first and second capacitors.

8. The system of claim 7 wherein the connection comprises a via connection.

9. The system of claim 7 wherein the connection comprises a ribbon connection.

10. The system of claim 7 wherein each of the first and second capacitors comprises a build-up layer.

11. The system of claim 7 wherein the dielectric layer has one of a low dielectric constant and a high dielectric constant.

12. The system of claim 7 wherein each of the first and second capacitors comprises Low Temperature Co-fired Ceramics (LTCC) fabricated components.

13. The system of claim 7 wherein the SOP further comprises:
   a monolithic microwave integrated circuit (MMIC) layer.

14. The system of claim 7 wherein the SOP further comprises:
   a system-on-chip (SOC) including a down-converter to down convert the RF signal to the IF signal and an up-converter to up convert the IF signal to the RF signal.

* * * * *